(12) United States Patent
Grange et al.

(10) Patent No.: US 7,994,991 B2
(45) Date of Patent: Aug. 9, 2011

(54) RADIATION DIAGRAM MEASURING SYSTEM FOR A TRANSMITTING ANTENNA

(75) Inventors: Matthieu Grange, Chavannes (CH); Arnaud Casagrande, Lignière (CH)

(73) Assignee: The Swatch Group Research and Developement Ltd, Marin (CH)

( * ) Notice: Subject to any disclaimer, the term of this patent is extended or adjusted under 35 U.S.C. 154(b) by 389 days.

(21) Appl. No.: 12/306,300

(22) PCT Filed: Jun. 6, 2007

(86) PCT No.: PCT/EP2007/055603
§ 371 (c)(1),
(2), (4) Date: Dec. 23, 2008

(87) PCT Pub. No.: WO2007/147736
PCT Pub. Date: Dec. 27, 2007

(65) Prior Publication Data
US 2009/0231217 A1    Sep. 17, 2009

(30) Foreign Application Priority Data
Jun. 23, 2006 (EP) ................................. 06116002

(51) Int. Cl.
*G01R 29/10* (2006.01)
*H01Q 1/24* (2006.01)

(52) U.S. Cl. ...................................... 343/703
(58) Field of Classification Search ............... 343/702, 343/703, 760, 894; 324/632, 637; 455/67.11, 455/67.12, 67.14, 67.16, 115.3
See application file for complete search history.

(56) References Cited

U.S. PATENT DOCUMENTS

| | | | |
|---|---|---|---|
| 3,441,936 A | 4/1969 | Heine | |
| 4,764,668 A | 8/1988 | Hayard | |
| 4,901,073 A | 2/1990 | Kibrick | |
| 6,087,941 A | 7/2000 | Ferraz | |
| 6,191,744 B1 | 2/2001 | Snow et al. | |
| 6,329,953 B1 * | 12/2001 | McKivergan | 343/703 |
| 6,850,851 B1 * | 2/2005 | Fourestie et al. | 702/65 |
| 7,035,594 B2 * | 4/2006 | Wallace et al. | 455/67.12 |
| 7,167,133 B2 * | 1/2007 | Nagashima | 343/703 |
| 2005/0176375 A1 | 8/2005 | Bednaz et al. | |
| 2006/0049595 A1 | 3/2006 | Crigler et al. | |
| 2009/0231217 A1 | 9/2009 | Grange et al. | |

FOREIGN PATENT DOCUMENTS

| | | |
|---|---|---|
| FR | 2 590 681 A1 | 5/1987 |
| GB | 1 188 578 | 4/1970 |
| GB | 2 234 877 A | 2/1991 |
| JP | 2003-43083 | 2/2003 |
| WO | 97/25239 | 7/1997 |

(Continued)

OTHER PUBLICATIONS

International Search Report issued in corresponding application No. PCT/EP2007/055603, completed Sep. 18, 2007 and mailed Oct. 1, 2007.
Office Action issued in co-pending related U.S. Appl. No. 12/306,313, dated Apr. 15, 2011.

* cited by examiner

*Primary Examiner* — Michael C Wimer
(74) *Attorney, Agent, or Firm* — Griffin & Szipl, P.C.

(57) ABSTRACT

The measuring system includes a receiver including at least one fixed receiving antenna for picking up electromagnetic fields generated by a transmitting antenna belonging to an electronic device, and a positioning device on which a support element is placed. The positioning device includes mechanisms for driving the support element in rotation. The measuring system further includes a detection device for detecting position/orientation of the transmitting antenna, and a data processing station. A hollow spherical element houses the electronic device, and is held on the positioning device by gravity on three points, one of which is formed by a drive member, and the two other points are formed using ball and socket joints. Several circular barcodes arranged on the external surface of the spherical element enable the system to determine the position/orientation of the spherical element using the digital camera.

15 Claims, 5 Drawing Sheets

Fig. 3A
Fig. 3B
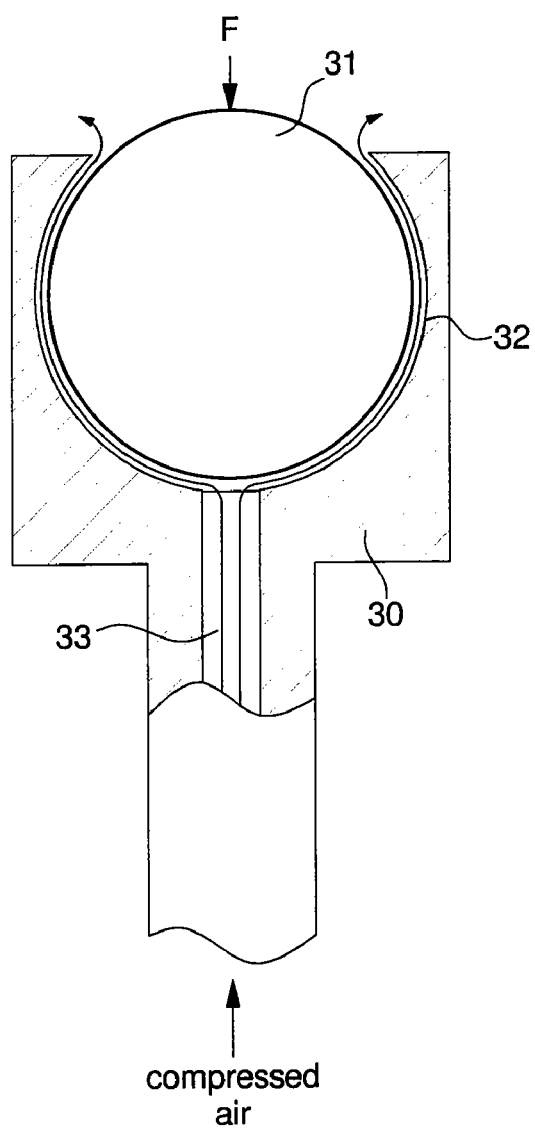
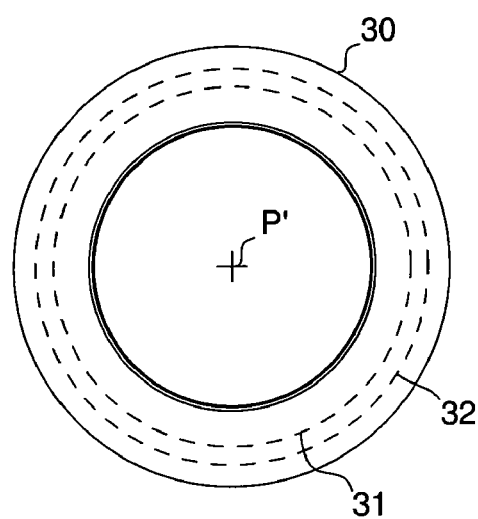

RADIATION DIAGRAM MEASURING SYSTEM FOR A TRANSMITTING ANTENNA

This is a National Phase Application in the United States of International Patent Application No. PCT/EP2007/055603 filed Jun. 6, 2007, which claims priority on European Patent Application No. 06116002.4, filed Jun. 23, 2006. The entire disclosures of the above patent applications are hereby incorporated by reference.

FIELD OF THE INVENTION

The invention concerns a radiation diagram measuring system for a transmitting antenna. The system includes a receiver device, fitted with at least one fixed receiving antenna, for picking up the electromagnetic field generated by a transmitting antenna that has to be measured, belonging to an electronic device, and a positioning device, on which a support element for the electronic device is placed. The support element is preferably a spherical element, inside which the electronic device is placed. The spherical element is held on the positioning device by gravity, on three support points. The positioning device further includes means, such as a drive member, for driving the spherical support element in rotation, with the electronic device, to rotate the transmitting antenna, which has to be characterized, relative to the fixed receiving antenna. The measuring system also includes means for detecting the position or orientation of the transmitting antenna on the positioning device, and a data processing station for data provided by the detection means and the receiver device.

BACKGROUND OF THE INVENTION

At least one receiving antenna, whose features are well known, is used to carry out a measurement of a transmitting antenna or test antenna radiation diagram. This receiving antenna is separated from the transmitting antenna to be measured by a certain distance, for example a distance of less than a few meters. To do this, the transmitting antenna, which forms part of an electronic device, is placed with the other components of the electronic device on or in a support element. The support element is then placed on a positioning device, which may be of the random type, i.e. able to move or orient the support element in any direction for measuring the electromagnetic field generated by the transmitting antenna.

According to the state of the art, as described, in particular, by U.S. Pat. No. 6,191,744 and JP Patent No. 2003-043083, it is known to perform a transmitting antenna radiation diagram measurement using at least one receiving antenna, moved around the transmitting antenna. To do this, the electronic device that includes the transmitting antenna is placed on a fixed support, whereas the receiving antenna is mounted on a mechanical structure, such as arms, for moving the receiving antenna relative to the transmitting antenna. The receiving antenna can be moved around the transmitting antenna at a fixed distance from the transmitting antenna. Each position of the receiving antenna is detected by position detecting means linked to the mechanical structure. In this manner, signals relating to the electromagnetic field that are picked up by the receiving antenna and positions signals are supplied to a data processing station, for calculation of the transmitting antenna radiation diagram.

One drawback of this type of state of the art measuring system lies in the fact that the mechanical structure that carries the receiving antenna is relatively complicated. With this measuring arrangement, this means that data signals cannot be provided to the processing station with the accuracy required for calculating the transmitting antenna radiation diagram.

U.S. Pat. No. 3,441,936 describes a device for positioning a spherical element in which a transmitting antenna can be placed. This spherical element is held, by gravity, on three drive wheels of the positioning device that are capable of orienting the transmitting antenna in any direction. When one drive wheel is being driven, in order to move the spherical element, the spherical element skids onto the other two drive wheels. This means that proper positioning of the transmitting antenna cannot be guaranteed, which is a drawback.

SUMMARY OF THE INVENTION

It is thus an object of the invention to provide radiation diagram measuring system for a transmitting antenna, which is simpler and more precise, for supplying data signals to a data processing station, which overcomes the drawbacks of the state of the art.

The invention therefore concerns the aforementioned radiation diagram measuring system for a transmitting antenna. In accordance with a first embodiment of the present invention, the radiation diagram measuring system (1), for measuring the radiation diagram of a transmitting antenna (4'), is provided wherein the system includes a receiver device (5) provided with at least one fixed receiving antenna (5') for picking up the electromagnetic field generated by the transmitting antenna (4') to be measured, belonging to an electronic device (4), a positioning device (2), on which a support element (3) for the electronic device is placed, the positioning device including means for driving the support element in rotation with the electronic device comprising the transmitting antenna, means (6) for detecting the position or orientation of the transmitting antenna, and a data processing station (7) for data supplied by the detection means and the receiver device, the support element being a spherical hollow element, which houses the electronic device with the transmitting antenna to be measured, and the spherical element is held on the positioning device by gravity on three points of support (P, P', P''), one of which is formed by a drive member (20, 21, 22) in contact with the external surface of the spherical element to rotate the element randomly in every direction on the positioning device, characterized in that the two other points of support of the positioning device are each formed by a ball and socket joint (30, 40), wherein the ball (31) is placed to rotate freely in an end housing (32) of the ball and socket joint, so that one portion of the ball emerges through an aperture in the housing to come into contact with the external surface of the spherical element (3).

Additional particular embodiments of the measuring system are defined in accordance with the present invention as follows. In accordance with a second embodiment of the invention, the first embodiment is modified so that the drive member (20) is a wheel (21) that comes into contact with the external surface of the spherical element to drive the element in rotation, the rotating axle of the wheel being mounted at the end of a support (22) that can rotate along another axle, which passes through the point of contact of the wheel on the external surface of the spherical element and the centre of the element, so as to impose a random rotation on the spherical element via the wheel, in every direction. In accordance with a third embodiment of the present invention, the first embodiment is modified so that the portion of the ball and socket joint that houses the ball is a nozzle, for bringing compressed air, so that the ball is held in the housing on an air cushion.

In accordance with a fourth embodiment of the present invention, any one of the first, second and third embodiments is further modified so that the detection means includes a digital camera (6), which is connected to the data processing station (7), and in that figures or references (10) are distributed over the external surface of the spherical element to enable the digital camera, associated with the data processing station, to determine the position or orientation of a transmitting antenna placed in proximity to the centre of the spherical element. In accordance with a fifth embodiment of the present invention, the fourth embodiment is further modified so that the figures or references are formed by circular barcodes (10), each circular barcode defining a precise position of the spherical element on the positioning device. In accordance with a sixth embodiment of the present invention, the fifth embodiment is further modified so that 14 different circular barcodes are uniformly distributed over the external surface of the spherical element, each circular barcode being encoded in 4 bits, and an external delimiting bit of a different colour to the colour of the external surface of the spherical element, to define the edge of each figure.

In accordance with a seventh embodiment of the present invention the fourth embodiment is further modified so that the system includes a lighting device (9) for lighting, in a uniform manner, the external surface of the spherical element that is visible to the digital camera. In accordance with an eighth embodiment of the present invention, the seventh embodiment is further modified so that the lighting device includes a set of optical fibers (92) guiding light generated by a light source distant from the spherical element to provide a homogenous light beam to improve the image of the spherical element, with the various figures visible, captured by the digital camera. In accordance with a ninth embodiment of the present invention, the eighth embodiment is further modified so that the set of optical fibers is divided into several sub-sets (93) of optical fibers, wherein the ends of the optical fibers of each sub-set in proximity to the spherical element (3) are secured in plastic studs (91) on a lighting structure (90). In accordance with a tenth embodiment of the present invention, the ninth embodiment is further modified so that the lighting structure, which is made of a non-metal material, forms a ring, on which several plastic studs (91), for example 6 plastic studs, are arranged for the optical fiber ends of the sub-sets, over the entire periphery of the ring and equidistant from each other, the ring being placed in front of the spherical element on the side of the digital camera (6), without obstructing the digital camera's view of the spherical element, and in that the ends of the optical fibers of each sub-set are oriented so as to direct light beams in the direction of the centre of the spherical element. In accordance with an eleventh embodiment of the present invention, any one of the ninth and tenth embodiments are further modified so that the number of optical fibers per sub-set is at least two optical fibers, and preferably 6 optical fibers, whose ends, which are secured in one of the plastic studs, which are equidistant from each other are arranged in the form of equilateral triangles.

One advantage of the measuring system according to the invention is that the transmitting antenna is placed inside the spherical element, with the electronic device, and in a central position in the spherical element. In this way, the drive member can drive the spherical element or hollow sphere randomly in rotation in every direction on the positioning device, so that the transmitting antenna rotates around the centre of the hollow sphere. The transmitting antenna is powered continuously by the electronic device, which includes, for example, a battery or rechargeable accumulator for measuring the electromagnetic field by the fixed receiving antenna of a receiver device.

Advantageously, the drive member includes a wheel that is in contact with the external surface of the hollow sphere, and a support for this drive wheel. The rotating axle of the wheel is placed at the end of the support, which is able to rotate along another axle passing through the point of contact of the wheel on the external surface of the hollow sphere and the centre of the hollow sphere. The support, which is rotatably mounted on a mechanical structure of the positioning device, and the drive wheel can be driven in rotation via compressed air means.

Preferably, none of the positioning device parts that are in proximity to the transmitting antenna are made of metal material, to avoid interfering with the measurement of the electromagnetic field generated by the transmitting antenna. Moreover, the receiving antenna and the spherical element with the electronic device having transmitting antenna are housed in an anechoic chamber. This prevents any reflection of the electromagnetic field onto obstacles that might interfere with the transmitting antenna radiation measurement.

Advantageously, the measuring system includes means for detecting the position or orientation of the transmitting antenna, which are formed by a digital camera, preferably placed in proximity to the receiving antenna. This digital camera, which is connected to a data processing station, makes it possible for the movement of the sphere, imposed by the positioning device, to be known in real time. Figures or references are also distributed uniformly over the external surface of the hollow sphere. This allows the digital camera and a position recognition algorithm, stored in the data processing station, to recognise each position of the hollow sphere, and thus the transmitting antenna, over time. These figures are preferably 4-bit encoded circular barcodes, and an additional external delimiting bit, which is always black on the light coloured (white) external surface of the sphere. Thus, by associating a measured field value with a measured position, it is possible to obtain the radiation diagram of a transmitting antenna.

For the digital camera to be able to take a good image, an isotropic (uniform) lighting device is advantageously provided for the visible surface of the spherical element or hollow sphere. Since all the parts in proximity to the transmitting antenna have to be made of a non-metal material, an optical fiber set guides the light provided by a distant light source to illuminate the spherical element. The optical fiber set is separated into several sub-sets in proximity to the hollow sphere. The ends of the optical fibers of a sub-set, which are for example 6 per sub-set, are fixed in a plastic stud secured to a lighting structure. 6 plastic studs preferably holding 6 optical fiber ends are secured equidistant from each other on the lighting structure. This lighting structure is configured in the shape of a ring and placed just in front of the spherical element on the digital camera side, without obstructing the digital camera's view of the sphere.

BRIEF DESCRIPTION OF THE DRAWINGS

The objects, advantages and features of the radiation diagram measuring system for a transmitting antenna will appear more clearly in the following description, with reference to the drawings, in which:

FIGS. 3a and 3b show a partial cross-section lengthways and a top view of a ball and socket joint of the positioning device of the measuring system according to the invention.

DETAILED DESCRIPTION OF THE ILLUSTRATIVE EMBODIMENTS

In the following description, all of the elements of the radiation diagram measuring system for a transmitting antenna, which are well known to those skilled in this technical field, will only be explained in a simplified manner.

Figure 1:
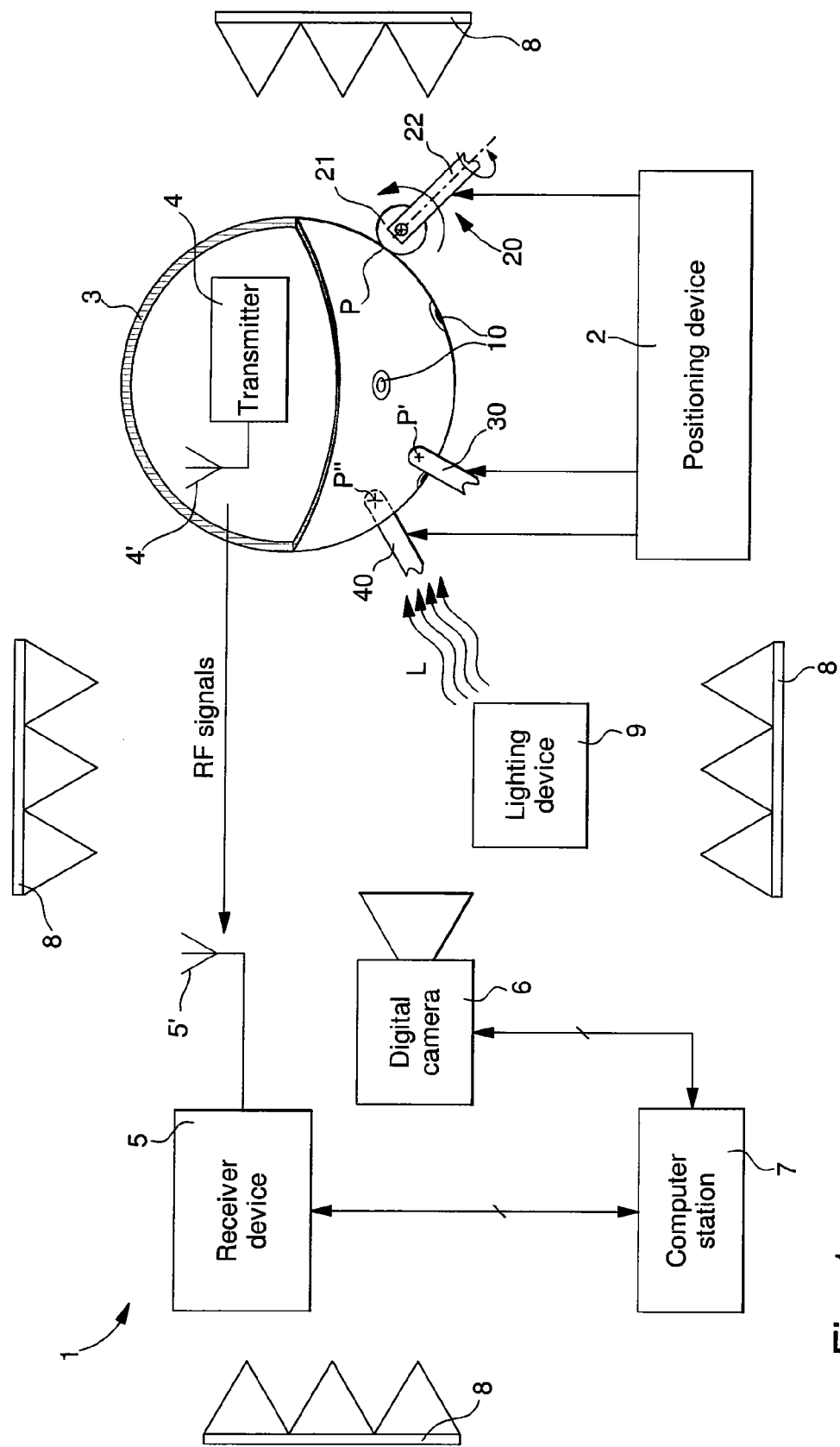
FIG. 1 shows, in a simplified manner, the various elements, which make up the transmitting antenna radiation diagram measuring system according to the invention.

FIG. 1 illustrates schematically all of the elements of radiation diagram measuring system 1 for a transmitting antenna 4' of an electronic transmitter device 4. Essentially, measuring system 1 includes, firstly, a positioning device 2, on which a spherical support element 3 for the electronic device is placed and held, by gravity, on three support points P, P', P" of members 20, 30, 40. The electronic device with transmitting antenna 4', which has to be measured, is held inside hollow sphere 3, which includes two parts, which fit on top of each other via any known means to close the electronic device. Transmitting antenna 4' is preferably positioned close to the centre of the hollow sphere.

The measuring system further includes a receiver device 5, provided with at least one receiving antenna 5' for picking up the electromagnetic field from transmitting antenna 4' (RF signals), means 6 for detecting the position or orientation of the spherical element that is moving on positioning device 2. The signals relating to the electromagnetic field picked up by the receiving antenna and position signals provided by the detecting means are transmitted, either automatically or upon demand, to a data processing station, which is preferably a computer station 7. Receiver device 5 and the detecting means, which are formed by a digital camera 6, can be electrically powered independently of the computer station or via the computer station.

For the sake of simplification, in FIG. 1, positioning device 2 is represented only by members 20, 30, 40 supporting spherical element 3 for measuring the electromagnetic field generated the transmitting antenna of the measuring system. This positioning device 2 thus includes a drive member 20, which is in contact with the external surface of the spherical element. This drive member is configured so that it rotates spherical element 3 randomly in every direction on the positioning device.

This drive member 20 is formed of a wheel 21, which comes into contact with the external surface of the spherical element to drive the element in rotation. The wheel can include a ring element made of rubber and arranged in a circular groove for driving the spherical element without sliding. The rotating axle of wheel 21 is mounted at the end of a support 22 or rod. This support 22 is able to rotate along another axle passing through the point of contact of the wheel on the external surface of the spherical element and the centre of the element. This means that a random rotation can be imposed on the spherical element via the wheel, in every direction. It takes an estimated time of 10 minutes for the spherical element to pass through every position. During this period of time, approximately 6,000 measurements can be made of the electromagnetic field, transmitted by the transmitting antenna.

Positioning device 2 also includes two ball and socket joints 30 and 40, explained below with reference to FIGS. 3a and 3b. Each ball in the ball and socket joints is arranged to come into contact with the external surface of spherical element 3. Thus, the contacts of wheel 21 and of each ball of the two ball and socket joints 30, 40 form the three points of support on which the spherical element rests. These three points of support can be regularly spaced to form the ends of an equilateral triangle preferably arranged horizontally. Of course, the centre of gravity of spherical element 3 must be in any position within the equilateral triangle in order to be held on the positioning device.

Instead of the three drive wheels of a prior art device, which formed the three points of support for the spherical element, the single drive wheel 21 does not skid on contact with the external surface of the spherical element. This allows spherical element 3 to randomly describe the entire position space, with a high degree of homogeneity. This drive wheel is preferably driven by a motor or compressed air turbine, which is not shown, which is housed in the support in proximity to the wheel 21. Compressed air pipes are made in the support to circulate the compressed air from a compressed air tank towards the motor.

Another motor or compressed air turbine can be used for driving support 22 of drive wheel 21 in rotation. In such case, a set of pulleys and drive belts (not shown), between the motor and support 22 can impose the desired rotation on the support in order to make the rotating axle of the drive wheel rotate. With this single drive wheel, the spherical element no longer jumps on the three points of support. The only observed movement of the spherical element away from the centre is due to its natural out-of-roundness and the play of the bearings (pulleys) of the order of a millimeter. This could involve an error in angle calculation of the order of 0.05 degrees in the measuring system, which is negligible.

FIGS. 3a and 3b show one of the ball and socket joints 30 of the positioning device to be used as one of the points of support for the spherical element. This ball and socket joint 30, which can be of generally cylindrical external shape, includes a housing 32 for a synthetic ball. The housing is sized such that the ball is free to rotate inside the housing. The housing may be spherical or cylindrical. Preferably, the ball and socket joint is made of a non-conductive material with a low friction coefficient, such as Teflon, for the freely rotating ball.

One portion of ball 31 emerges from housing 32 via a top aperture in ball and socket joint 30 to come into contact with the external surface of the spherical element. A force F, representing one part of the weight of the spherical element, is applied to point of support P' on the ball. The diameter of this aperture is smaller than the diameter of the ball, so that the ball is held inside housing 32.

For a housing of spherical shape, the ball and socket joint includes two parts that fit onto each other lengthways to trap the ball in the housing. In the case of a cylindrical housing, however, the top aperture is made in a cover (not shown), which partially closes the housing. The ball and socket joint is also configured in the form of a nozzle, to bring compressed air, via a pipe 33 in the ball and socket joint, right into the ball housing 32. Thus, the ball is held in its housing on an air cushion.

If spherical element 3 is placed only on two compressed air nozzles whose flow is regulated, whereas the third point of support is the drive wheel, it is easy to make the spherical element float and rotate. However, in some cases, an oscillating movement animates the spherical element. The element moves closer to a nozzle, which increases the air pressure and ejects it slightly. If the local pressure, and thus the supporting force, decreases, the spherical element falls back onto the nozzle, which then ejects it again. Consequently, with compressed air nozzles, the air pressure has to be regulated in accordance with the weight of the sphere, which is resolved by the ball and socket joints according to the invention. A thread of compressed air comes out of the housing aperture around the ball, whose pressure depends upon the weight of the spherical element, which avoids the problems of simple compressed air nozzles. The spherical element can be driven freely in rotation without surges in every direction.

In order to overcome any problem linked to lack of balance of the spherical element on the three points of support, the weight of the spherical element can be increased by introducing an additional ball and socket joint, or a pressure spherical joint to the tip of the sphere. This ball and socket joint can be made using a ball that slides in a compressed air tube and generates a constant force on the spherical element, like a spring. The resultant of this normal pressure in contact with the drive wheel enables the wheel to adhere better.

Most of the components of the measuring system are placed inside an anechoic chamber, illustrated by the elements referenced 8 in FIG. 1. This prevents any reflection of the electromagnetic field generated by transmitting antenna 4' onto obstacles that might be detrimental to the transmitting antenna radiation measurement. Moreover, none of the parts of the positioning device in proximity to the transmitting antenna, i.e. inside the chamber, must be made of metal material, so that they do not interfere with measurement of the electromagnetic field generated by the transmitting antenna. The drive means for positioning device 2, which are made of plastic or of a non-conductive material, operate using compressed air. These drive means may be motors or compressed air turbines, connected by pipes with taps to a compressed air tank. These non-metal motors for driving the wheel and wheel support along two axles, can thus be placed in proximity to the transmitting antenna.

In order to determine precisely the position or orientation of spherical element 3, and thus the transmitting antenna 4' that it contains and which has to be measured, specific figures or references 10 are placed on the external surface of spherical element 3. These figures and references are formed by circular barcodes, with each circular barcode defining a precise position of the spherical element on the positioning device. Each circular barcode 10 can be printed or bonded onto the external surface of the sphere or made by any other means.

There are, for example, 14 different circular barcodes, which are uniformly distributed over the external surface of the spherical element, as explained below with reference to FIGS. 5 and 6. Each circular barcode is encoded in 4 bits, and one external delimiting bit of a different colour to the external surface of the spherical element. The external surface of the spherical element is preferably light coloured, for example white, whereas at least one additional external delimiting bit is dark coloured, for example, black.

In order to improve the images captured by the digital camera, which must be able to take, for example, 15 images per second, measuring system 1 further includes an isotropic lighting device 9. This lighting device 9 is configured so as to provide light beams L in the direction of at least half of the external surface of spherical element 3 on the side of digital camera 6.

Figure 2:
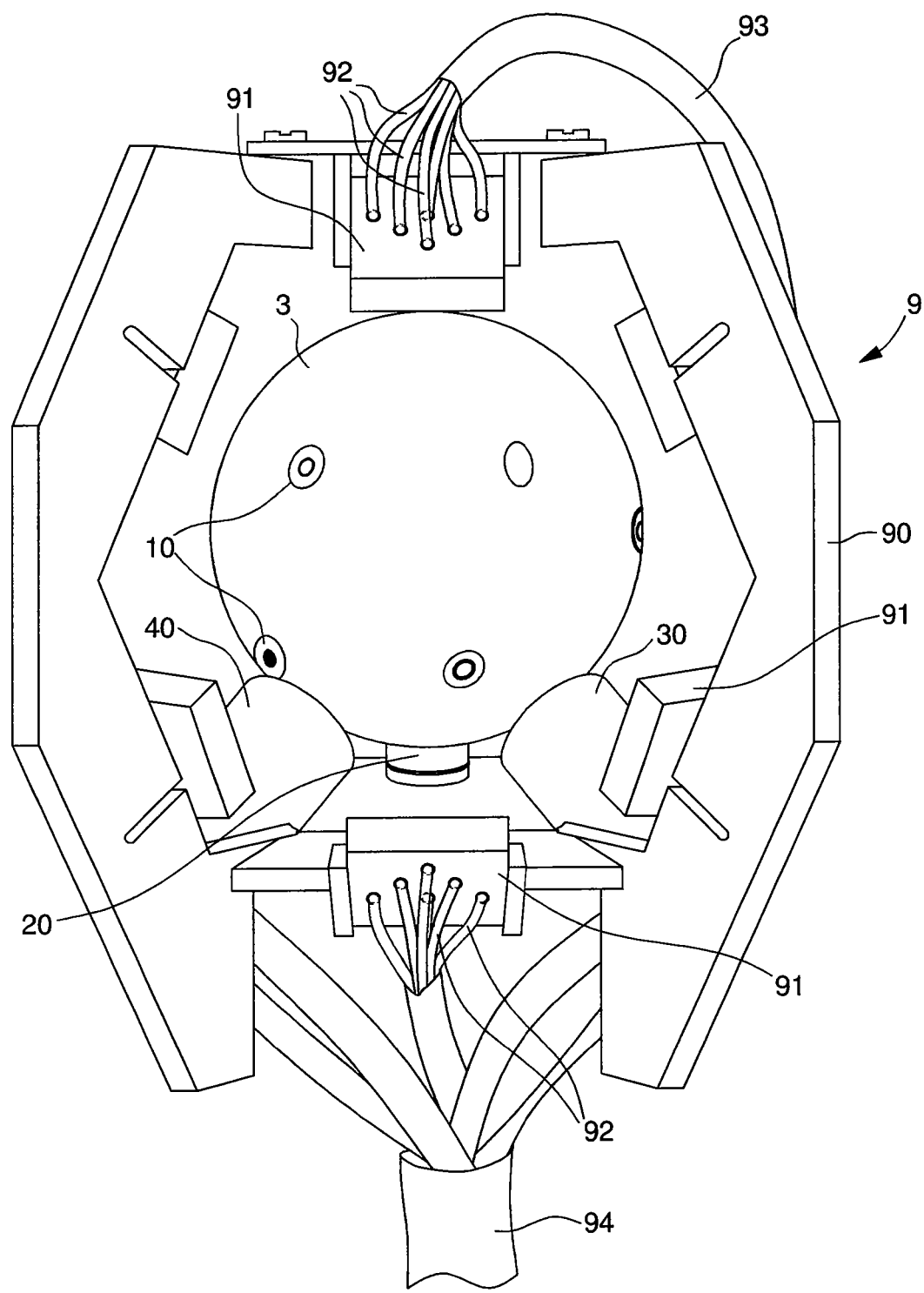
FIG. 2 shows one part of the lighting device for illuminating the spherical element, placed on the positioning device of the measuring system according to the invention.

Lighting device 9 of the spherical element or hollow sphere 3, which is provided with various circular barcodes, and which is placed on the three points of support P, P', P''' of members 20, 30, 40 of the positioning device, is now explained with reference to FIG. 2.

It has been demonstrated that, for optical position recognition, the measuring system has a high level of sensitivity to lighting homogeneity. Previously, lighting via LED type light sources, arranged between absorption cones of the anechoic chamber, was used. However, it was observed that, when using 1 W LEDs, the power was insufficient to provide a good level of lighting. Moreover, the aperture angle of the LEDs is of the order of 110°, which requires the use of focussing lenses in front of the LEDs. What is more, securing and electrically powering the LEDs in the anechoic chamber raises a problem, because of the connection by a metal wire to each LED, which can be detrimental to the transmitting antenna radiation measurement.

For the lighting device according to the invention, a set of optical fibers 92 is used, wherein one end of each fiber is arranged in proximity to a light source (150 W) that is not shown, for receiving light. This light source is placed, for example, outside the anechoic chamber (not shown). This light source could be of the type used for coaxial microscope lighting. The set of optical fibers is grouped in a plastic sheath 94 to be directed into the anechoic chamber to a plastic lighting structure 90.

The optical fibers 92 used are preferably synthetic fibers wherein the end on the light source side is at a distant of, for example, 3.5 cm from the light source, to prevent the fibers from burning. Because of their flexibility, these synthetic fibers are easy to handle. They can have a diameter of the order of 1 mm.

The set of optical fibers groups together 36 sufficiently long optical fibers (4 m) protected by the plastic outer sheath 94. The set of optical fibers is also divided into several sub-sets of optical fibers, protected by another plastic sheath 93, inside outer sheath 94, preferably 6 sub-sets of 6 optical fibers each protected by another sheath 93.

The ends of the optical fibers of each sub-set are secured in a square plastic stud, which has 3.5 cm sides and is 1 cm thick. The ends of optical fibers are arranged at equal distance from each other in each stud in the shape of equilateral triangles of 1.5 cm sides. 6 plastic studs 91 are regularly arranged on the periphery of the ring-shaped lighting structure 90. The ends of the optical fibers secured in the plastic studs of each sub-set are oriented so as to direct light beams in the direction of the centre of the spherical element. In this manner, the spherical element is lit in a homogenous manner, because of the set of the optical fibers and the arrangement thereof in proximity to the spherical element, without the use of any metal material.

Ring-shaped lighting structure 90 is arranged between the digital camera and spherical element 3, but in proximity to the spherical element. It can be mechanically connected to the positioning device. The dimension of the lighting structure is slightly larger than the diameter of the spherical element, which may be of the order of 12 cm. The digital camera, which may be at a distance of one or two meters from the spherical element, must be able to observe the whole spherical element through lighting structure 90.

Figure 4:
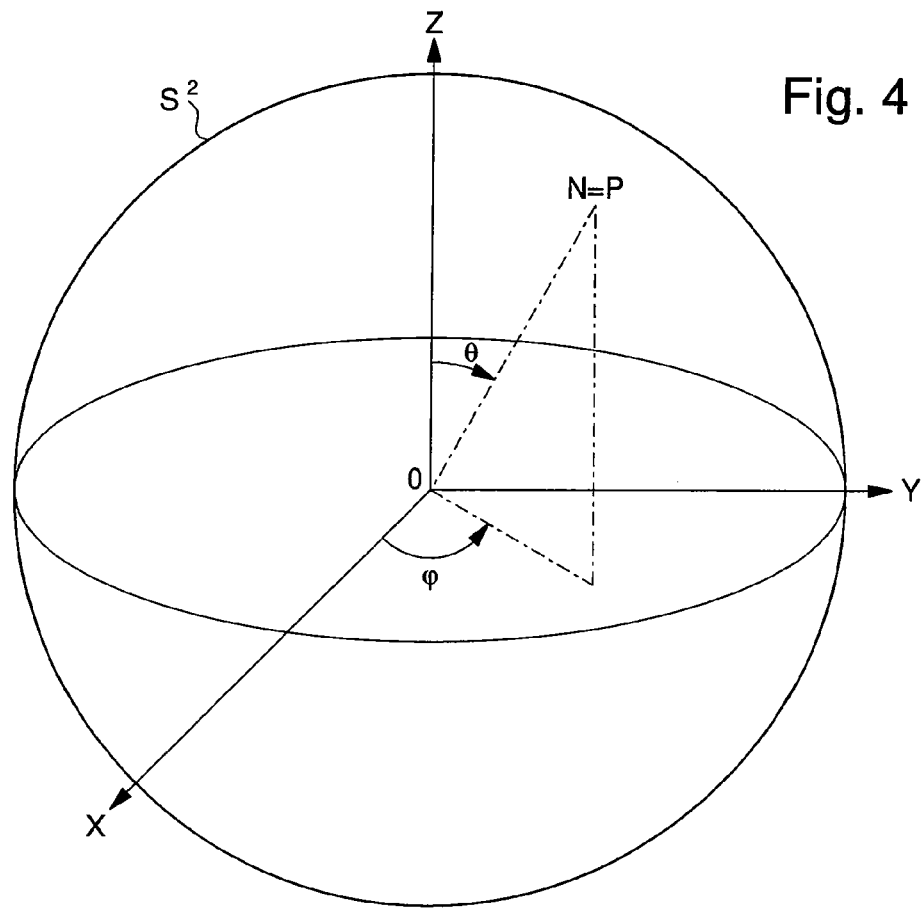
FIG. 4 shows an illustration of the spherical coordinates used to determine the position of the spherical element on the positioning device of the measuring system according to the invention

The way in which the measuring system operates, to determine the transmitting antenna radiation diagram is described now with reference to FIGS. 4 to 6 below. It should first be noted that, in order to carry out all of the measuring operations, the transmitting antenna is always active so as to generate an electromagnetic field at a frequency, which may be of the order of the GHz. The electronic device with a transmitting antenna thus includes its own electric power source, such as a battery or rechargeable accumulator, given that it is enclosed in the spherical element. With this measuring system, one could measure the transmitting antenna of a portable telephone (GSM), for example, or any other apparatus that can be enclosed in a spherical element.

For the spherical element position measurements with the various circular barcodes that the spherical element includes on the outer surface thereof, the types of measurement are based on the Euler angles $\theta$, $\Phi$, $\psi$, which define the elevation, azimuth and polarisation of the rotational planes. In mechanical applications, it is preferable to use the Euler angles to determine the position of a solid, such as the spherical element.

One point P, located in a three-dimensional space, is generally expressed by three coordinates P(x,y,z). These coordinates depend upon the type of coordinates selected (or referential). The Cartesian referential includes 3 orthonormal vectors x, y, z. Depending upon the type of application, the referential used changes to facilitate calculations or display.

The position of an antenna in space is characterized by 6 values. The first 3 values are none other than the coordinates of its centre of gravity. The other 3 values are the 3 Euler angles $\theta$, $\phi$, $\psi$, (elevation, azimuth and polarisation of the rotational planes), of which only two angles are indicated in FIG. 4.

The positioning device can place the spherical element, which contains the transmitting antenna to be measured, in any position or orientation, i.e. in the entire space of the three Euler angles (elevation $\theta$, azimuth $\phi$, and polarisation $\psi$).

From the measurement point of view, this positioning device is very efficient, since it can measure an unknown antenna in every linear polarisation with a simple fixed linear polarising antenna, called a receiving antenna. Indeed, for a given point on the surface $S^2$ of the spherical element, every polarisation comprised between 0 and 360° can be measured. In fact, simply those polarisations between 0 and 180° are sufficient, since the receiver does not supply any information as to the phase of the measured field E, and a polarisation of 10° gives the same measured field value as a polarisation of 190°.

Since the measured E phase is unknown, a single measurement fills two positions in space $\theta$, $\phi$, $\psi$, since IE($\theta$, $\phi$, $\psi$)I=IE($\theta$, $\phi$+180°)I. However, this information as to the absolute value of the various polarisations does not enable the direction of circular polarisations to be calculated simply. To do this, two receiving antennas of the circular levorotatory and dextrorotatory type have to be used simultaneously to determine the direction of rotation of vector E as shown symbolically with reference to FIG. 7, explained below. However, the simple complete measurement (v comprised between 0 and 180°) with a linear antenna can quickly determine the polarisation ellipsis, if the expected polarisation is known in advance to be circular.

In the measuring system according to the invention, two orthogonal linear polarisation antennas can be used in succession. It is therefore redundant to measure several polarisations for the same point of the sphere surface, which corresponds to one point on the radiation diagram. Thus, for a potential radiation diagram measurement for linear polarisation antennas, one polarisation angle value is enough for each pair of elevation ($\theta$) and azimuth ($\phi$) values. $E^2=E_x^2+E_y^2$ can easily be calculated. Care must, however, be taken, since if the polarisation is circular, the calculation will be distorted by 3 dB.

The computer station software can thus display the plane of the elevation-azimuth angles, and when the plane is sufficiently full, the user can decide to end the measurement. In the three-dimensional space of the three Euler angles, this plane is a projection onto the elevation-azimuth plane and is consequently filled much more quickly than the aforecited three-dimensional space.

For the sake of simplifying the system, measurement along the two polarisations $E_x$ and $E_y$ is carried out successively and not simultaneously. Since the measuring system can actually measure 40 times the field E between two positions (20 times $E_x$ and 20 times $E_y$ in an interlinked manner), and if the rotational speed of the spherical element is sufficiently low, the position of two successive samples $E_x$ and $E_y$ can be considered to be virtually the same. It is, of course, possible to interpole the measured fields and the positions so as to determine exactly $E_x$ and $E_y$ at the same place. The two first acquisitions at a measured and calculated position are used while their two positions are considered to be identical for the calculation of $E^2=E_x^2+E_y^2$.

One could also envisage measuring $E_x$ and $E_y$ simultaneously. In such case, the reception chain has to be doubled, and a relative calibration has to be performed for two measuring system portions, which is not necessary for the measuring system according to the invention, given that the same receiver is used for two measurements.

For calculating rotation in three-dimensional space, it should first be pointed out that the digital camera generates a spherical deformation of the observed image, in particular of the spherical element or hollow sphere on the positioning device. For a distance greater than 1 m between the camera and the spherical element, the error is less than 0.2%.

Ignoring the above developed spherical deformation, it easily becomes possible to calculate the $3^{rd}$ coordinate (as y, z have been measured, x is determined by the equation $x=(r^2-y^2-z^2)^{1/2}$). Rotation at the three Euler angles is a transformation called a base change. The mathematical resolution of this transformation requires three equations, namely one equation per reference vector. However, rotation is an isometric transformation, which has the feature of maintaining angles. In the case of the spherical element of the invention, measuring two transformed vectors is sufficient to determine the base change completely, since the third unknown is contained in the aforecited isometric feature. An extremely simple and efficient way of resolving the system is to construct a third vector by the vectorial product of the two first vectors and to include it in a matrix resolution system.

It will be noted that the reverse matrix associated with each pair of vectors can easily be pre-calculated and stored in the memory of the computer station prior to the measuring phase, in order to decrease the processor load and increase the power available for recognising shapes or circular barcodes. The matrix R thus calculated contains values that have already been transformed by conventional trigonometric functions.

The number of points covered on the spherical element is indicated during the measurement. Objective data as to the progression of the measurements is thus obtained. This analysis is based on the rotation matrix. Once calculated, we have the three Euler angles. Considering $\theta$ and $\phi$, and based on the FIG. 4 diagram of the spherical coordinates, this means looking to see whether the point P covers all of the points on sphere $S^2$. This is the same as observing whether ($\theta$, $\phi$) cover all of the points of the rectangle R=[0, π]×[−π, π] where θ is the longitude of P and φ is the latitude of P. The North and South Poles of $S^2$ are singular points for the spherical coordinates. Some precautions must therefore be taken in calculating θ and φ.

As regards recognition of the position or orientation of the spherical element on the positioning device, an MOS black and white digital camera with 768×1024 pixels is used. This camera takes 15 images per second and supplies a signal corresponding to exposure to the computer station, which includes stored recognition software that is quick and accurate. As the camera is a black and white camera, it is therefore possible to work on the shapes of the figures, which are preferably circular barcodes 10. The dimensions of the figures selected (circular barcodes) do not exceed 12 mm. When the spherical element fills the image captured by the camera, there are 768 pixels over 12 cm, i.e. 76.8 pixels per figure (12 mm), which is sufficient. Given the shape of the spherical element, circular barcodes are preferably used to cover the external surface of the spherical element. If the convexity of the spherical element is ignored, projection onto a tangent plane transforms the circles into ellipses. The centre of a circle is thus transformed into the centre of an ellipse, whose position thus exactly defines that of the circle of the circular barcode figure.

In order to see properly more than 2 circular barcodes in the image captured by the camera, 14 circular barcodes are distributed over the spherical element as follows: 2 for each Pole, 4 for the Equator, 4 for each hemisphere as shown partially in FIG. 5. Each FIG. 10 located in the hemispheres is equidistant from the Pole and from two figures on the Equator.

Figures 5, 6:
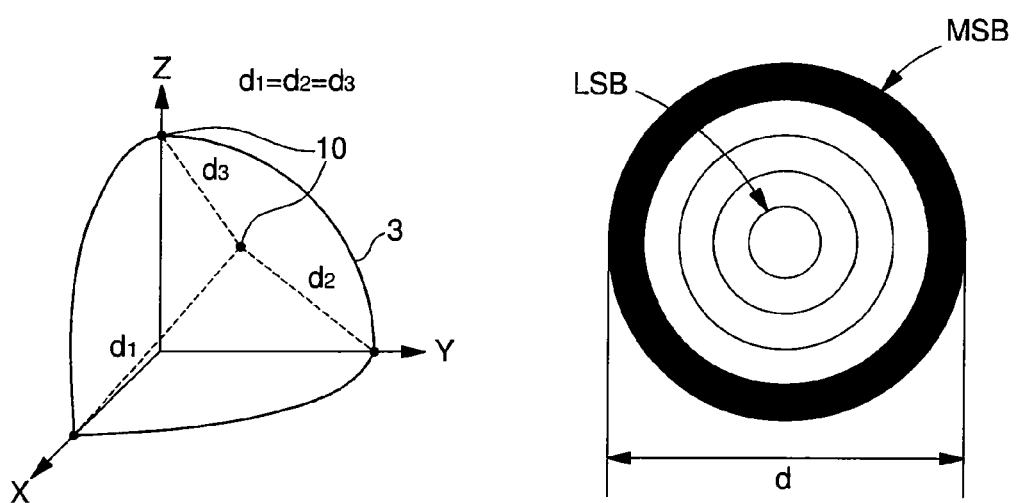
FIG. 5 shows the position of each figure or reference on the external surface of the spherical element on the positioning device of the measuring system according to the invention.
FIG. 6 shows a figure in the shape of a circular barcode to be placed on the external surface of the spherical element to determine the position or orientation of the transmitting antenna of the measuring system according to the invention.

4 bits are thus used to encode 14 figures (circular barcodes), and one external delimiting bit that is always black, and which defines the edge of the figure as shown in FIG. 6. The centre of each circular barcode defines the less significant bit (LSB), whereas the external bit defines the more significant bit (MSB). Each bit in state 1 is black, whereas each bit in state 0 is light-coloured, in particular white. With 12 mm diameter patterns, there are approximately 7.68 pixels per encoding bar.

The table below shows the position of the figures on the external surface of the spherical element with the hexadecimal code and spherical position coordinates (in cm):

| Position | Hexadecimal code | Position in cartesian coordinates |
|---|---|---|
| North Pole | 1 0 0 1 1 | (0, 0, 6) |
| South Pole | 1 0 1 1 1 | (0, 0, −6) |
| Equator | 1 0 0 0 0 | (6, 0, 0) |
| | 1 1 1 0 0 | (0, 6, 0) |
| | 1 0 0 1 0 | (−6, 0, 0) |
| | 1 1 0 0 0 | (0, −6, 0) |
| North Hemis. | 1 0 1 0 0 | (3.46, 3.46, 3.46) |
| | 1 1 0 1 1 | (−3.46, 3.46, 3.46) |
| | 1 1 1 1 0 | (−3.46, −3.46, 3.46) |
| | 1 0 1 1 0 | (3.46, −3.46, 3.46) |
| South Hemis. | 1 0 0 0 1 | (3.46, 3.46, −3.46) |
| | 1 1 1 0 1 | (−3.46, 3.46, −3.46) |
| | 1 0 1 0 1 | (−3.46, −3.46, −3.46) |
| | 1 1 0 0 1 | (3.46, −3.46, −3.46) |

For the rotation calculation in the computer station, the rotation matrix defines the rotation of the spherical element relative to an initial position on the positioning device. However, if the radiation diagram is being set up, the usually described rotation is that of the receiving antenna and thus that of the digital camera, relative to the spherical element that contains the transmitting antenna being measured. This is thus the reverse rotation (that of the relative movement), referenced $R^{-1}$. Since R is an isometric transformation, $R^{-1}$ is directly equal to the transpose of, R referenced $R^T$. The θ, φ and ψ angle values then have to be reconstructed. This reconstruction is carried out by a procedure calling on the reverse trigonometric functions in a very precise order in order to clarify any possible undeterminations.

For processing the image captured by digital camera 6 shown in FIG. 1 in computer station 7, a calibration phase is first of all carried out to detect the centre of spherical element 3, and its radius is measured. Subsequently, two FIG. 10 (which are circular barcodes) of the image are recognised and their positions are calculated. Then an estimate is made of the calculation errors introduced. 4 distinct sequences are thus carried out for the measuring system, namely calibration, input/output initialisation, $E_x$, $E_y$ field position calculation and acquisition, and data saving.

For the calibration phase, the first operation consists in calculating the radius and centre of the circle that passes through the contour of spherical element 3. This operation determines a reference and decreases the image surface to be processed. Only one square area, with a side of 0.95×radius, and which is centred on the spherical element, is kept. Next, the image is digitised. The optimum threshold is determined by a statistical method.

As regards initialisation, the inputs/outputs are initialised by assigning the various input/output ports of an acquisition card connected to the computer station to the different signals. An analogue input is used for the received signal strength indicator (RSSI). A digital input is assigned to the camera aperture signal, and a digital output delivers a square signal at 600 Hz. This signal temporarily multiplexes $E_x$ and $E_y$.

The calculation and acquisition sequence includes two parallel loops. The user of the measuring system can interrupt these loops. One loop generates the square 600 Hz signal and samples the aperture signal and RSSI signal data ($E_x$ and $E_y$ field power). At each iteration, this data is stored in a table, which gradually fills up as the programme progresses. The second loop calculates the position of the spherical element being filmed. At each iteration, the image is analysed to determine the two visible figures closest to the centre and their pixel position. The Euler angles are then calculated then stored in a table. Finally, all the measurements taken are saved.

The $E_x$ and $E_y$ RSSI signals are measured in accordance with a logarithmic scale. The measurement carried out requires $E_x^2$ and $E_y^2$, which is easily obtained by adding together two successive RSSI signals. Also, since $E_x^2+E_y^2+E_z^2$, it is not necessary to determine whether the angle concerned is $E_y$ or $E_x$ in the case of measuring system. If that option were necessary, the signal controlling polarisation would then have to be sampled.

The figure position detecting algorithm requires a precise universal referential, to prevent a systematic error in the calculated positions. Two automatic detection algorithms have thus been developed, which are a thresholding method and an intercorrelation method.

The thresholding method is based on contour detection via thresholding. A rising edge is identified on segments placed in the arc of a circle on the top hemisphere of the spherical element. Once the points have been found, a least square algorithm interpoles the equation of the corresponding circle. When using this algorithm, it will be noted that the shadow on the edge of the spherical element due to the lack of lighting homogeneity, interferes with contour detection. A more robust algorithm is therefore critical.

The intercorrelation method uses correlation of two images in order to find the coordinates of the circle delimiting the contour of the spherical element. The first image is that captured by digital camera 6. The second image shows a white disc, whose radius is known, centred on a black background. If the intercorrelation function is calculated, the maximum determines the centre of the spherical element. In order to find the radius, a calculation iteration is performed with a reference circle of variable radius.

For an image of 200×200 pixels, the calculation time is of the order of a second. It therefore takes a long time to perform on an image of 768×1024 pixels. Consequently, only some parts of the image are exploited. In the knowledge that 3 points are required to determine a circle, 3 zones are captured in the image.

On the basis of a function giving the maximum of the sum of the two-dimensional intercorrelation functions of the 3 zones, it is possible to detect the index of the column and line of the maximum and thus to calculate the position of the centre of the spherical element. The calculation is then iterated with images of variable radius. In order to do this, a geometric method is used. The calculation is iterated 4 times on a radius that varies from 280 to 380 by steps of 25. The two radii, with which the intercorrelation function is maximum, are identified for reiteration 5 times per step of 5 in the interval. A last iteration with steps of 1 determines the radius. This method avoids iterating on all the radii.

To correctly carry out the intercorrelation product of the two images, their continuous components have to be cancelled The means of the image elements is thus subtracted from the original image prior to the intercorrelation product. After several tests, it is observed that the radius found largely depends upon the value of the DC component. The continuous value over 256 levels has a value of 45.

For manual detection, it is noted that the results of the two algorithms described above greatly depend upon lighting and thus upon the DC component of the source image. This is why we have opted for manual calibration by the user and not automatic detection. The human eye can distinguish the contour of the spherical element almost perfectly and this prevents any wasteful error, which would distort all of the measurements.

We will now describe a figure position detection algorithm. Above all else, the limitations linked to recognition of the figures must be well defined. The lighting of the spherical element gives rise to a series of specular reflections that can destroy the contrast of FIG. 10 (circular barcodes) locally, and generate errors as to the position and encoding of objects.

The exposure time of camera 6 generates a blur on the edge of the figures, for a given rotational speed and figure position. Taking one figure on the edge of the sphere and a rotational speed of 1 revolution per second, the blur for an exposure time of 10 ms is $\Delta d = 10 \text{ ms} \cdot (2\pi/1000) \cdot 0.06 \text{ m}$, which equals 4 mm. The exposure time eventually chosen is approximately 3 ms. Moreover, if one of the two figures is close to the centre and the other is at the periphery, and in the case of a polarisation rotation, the angle between the two figures may be distorted.

The actual position recognition uses two functions, which work on a binary image and use image-processing algorithms. As regards the figure type detection algorithm, once the position of the spherical element has been determined and the calculations of the centre, major axis and minor axis have been carried out, a figure recognition procedure can determine the FIG. 10 being observed. Once the figures have been defined, they are represented by their centre and 2 axes.

A first algorithm processes the detected figure so as to select the most representative half major axis. Since the reflections generally appear in the form of less contrast and greater luminosity, the mean luminosity along the two half major axes is compared, and the lowest value is selected. Since a full black circle is a prohibited pattern, a second algorithm extracts the image line along the selected half major axis and then removes the continuous level by subtracting the mean value. A third algorithm multiplies and totals the profile obtained above with 14 vectors representing the 14 figures. The size of these vectors, and that of the half major axis is directly deducted, by calculating from the spherical element radius obtained during the calibration phase. The figure is determined by the maximum of the 14 multiplications—products.

The size of the source vector varies in accordance with the position of the figure on the spherical element, smaller in the edges. The vector size is thus not always equal. Assuming that the source vector size has a value N, rather than removing elements from the vector, which would cause a phase shift, the elements of the source vector are repeated 5 times (dimension=5·N). The sizes of the vectors are thus equal and the algorithm can work.

The $\theta$–$\phi$ graph of calculated positions is continuously displayed on the computer station screen. The captured image could also be displayed in real time, with the figures delimited by a rectangle. This allows the detected figures to be easily observed. A cube, whose movement corresponds to that of the spherical element, could also be displayed. The display is updated for each image. In the event of error, the last correct position is kept.

During saving, the programme in computer station 7 stores 6 vectors, namely the exposure signal, the RSSI signals ($E_x$/$E_y$ temporarily interleaved one after the other), $\theta$, $\phi$, $\psi$, and the boolean error. These vectors do not all have the same length. In fact, the exposure signal and RSSI signals are acquired simultaneously so as to synchronise the measurements with the calculated positions. The post-processing includes 3 steps, which are attributing the right position to the right measured RSSI signal, checking the rotation carried out and removing any errors, and displaying the results.

At each iteration, 40 RSSI signal values are measured for one calculated position. The exposure signal and RSSI signal vectors have N elements, whereas $\theta$, $\phi$, $\psi$, and the boolean of error have N/40 elements. These values are stored in a table.

The two RSSI values, which are synchronous with an image, immediately follow the falling edge of the exposure signal. Then, the first element of position vectors $\theta$, $\phi$, $\psi$, and the boolean of error is removed, since the RSSI signal at time t is attributed to the calculated position t+1.

One way of checking whether the calculated rotation is correct, is to calculate the difference in angle between two successive rotations. The distance of two successive rotations of a point on a sphere of radius 1 is estimated. If this distance is greater than a threshold, there is an error.

Synchronisation between the position calculation and measurement is fundamental and constitutes one of the main difficulties of the measuring system. Indeed, the image processing software can control a series of treatments on an image flow, but the timetable for obtaining position calculation results is not deterministic. This timetable in fact directly depends upon the system load, the low-level task activity of the computer station, the network interface card, and disc accesses. It is thus essential to have an absolute reference in order to know the precise moment at which the image was taken, otherwise the radiation diagram will be arbitrarily distorted locally by a variable angle. The computer station must take account of the image flow and thus the calculated position flow, and the measured RSSI flow relative to the electromagnetic field picked up by receiver device 5.

In order to guarantee synchronisation between the position flow and RSSI flow and to allow any interpolation of the measured positions for improved measurement resolution, measuring system 1 carries out oversampling 40 times between two consecutive images. Since two polarisations ($E_x$ and $E_y$) are measured, a resolution of $1/20^{th}$ of the angle variation between two consecutive positions is obtained. The basic idea of synchronisation consists in sampling, at the same frequency (600 Hz), the aperture signal available directly across the digital camera. This signal is triggered when the image is taken and has exactly the same length as the exposure (approximately 1 to 3 ms). In order to be sampled by the acquisition card, this very short signal is artificially lengthened by a monostable flip-flop. Through post-processing, the calculated position flow has only to be slid relative to the RSSI flow such that the leading edge of the sampled transition, which represents the shot, falls onto the next calculated position. The delay due to the calculation is always positive.

Figure 7:
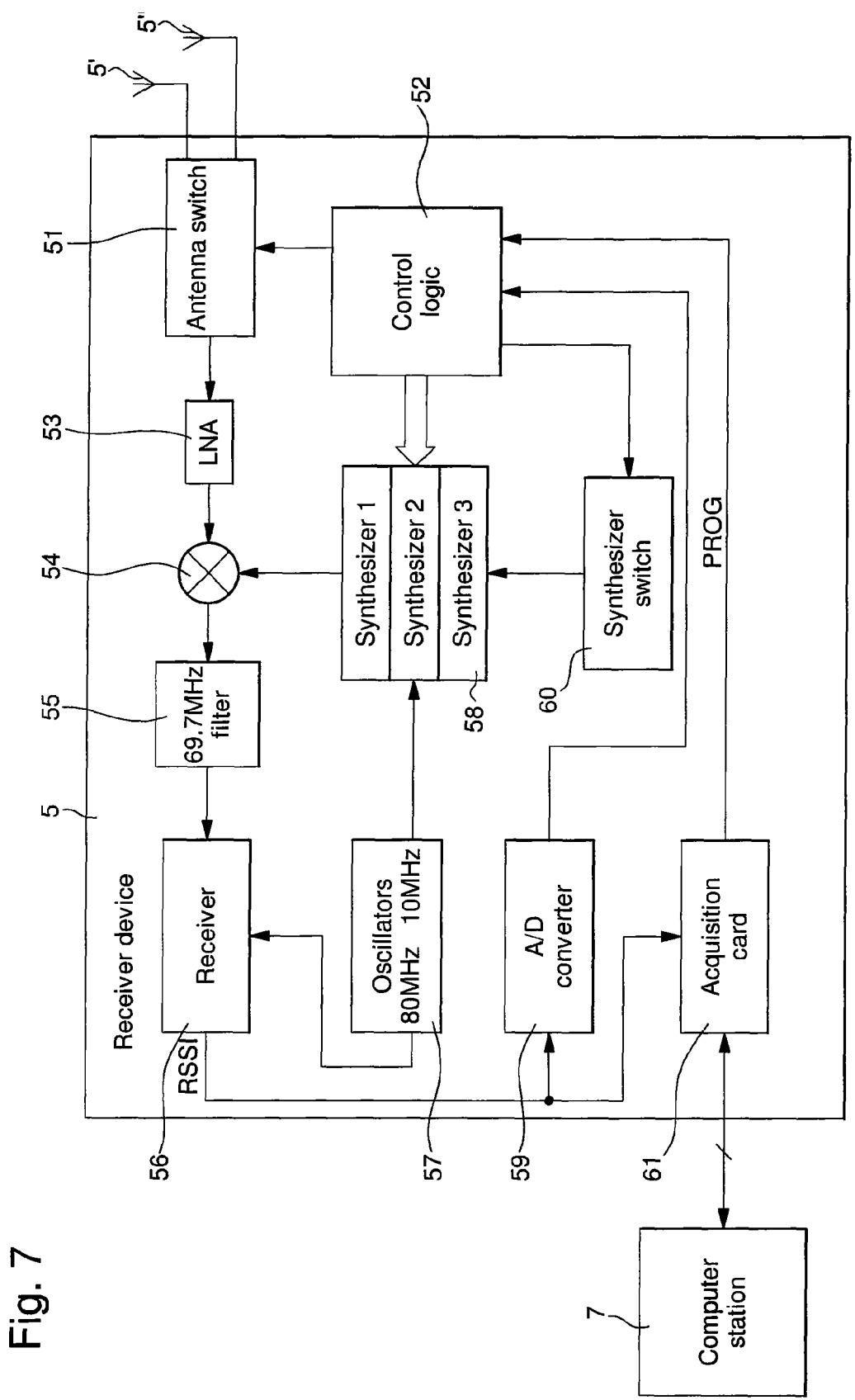
FIG. 7 shows the various components of the receiver device of the measuring system according to the invention.

One embodiment of receiver device 5 of the measuring system is shown with reference to FIG. 7. It should be noted that, in order to carry out the RF signal strength measurement, a commercially available receiver is preferably used, which bears the reference SA626, by Phillips. This receiver 56 contains a dual frequency change heterodyne receiver, and a rapid RSSI. The maximum working frequency of this component does not exceed 500 MHz. A first frequency change, performed by an external mixer 54, is therefore necessary.

The RF architecture of receiver device 5 includes, in a conventional manner, an antenna switch 51, controlled by a control logic 52, for connecting either a first receiving antenna 5', or a second, differently polarised, receiving antenna 5", as described above. This RF architecture further includes an amplifier with an LNA filter 53, a mixer 54 for carrying out a frequency conversion, an image filter 55 (69.7 MHz), which supplies a filtered signal to the SA626 receiver. A synthesizer unit 58, which is clocked by signals supplied by an oscillator unit 57, supplies a high frequency signal to mixer 54, to carry out the first frequency conversion.

Cascade-connected ceramic IF filters (not shown) can also be used, for example, at the output of receiver 56, to shape the RSSI signals. A 12-bit A/D converter 59 converts the analogue signals into digital signals for control logic 52. The 69.7 MHz filter 55 is configured to play the dual part of filter and impedance adaptor. The two 10.7 MHz ceramic IF filters are standard and have a bandwidth of around 250 kHz.

With the two receiving antennas 5' and 5", the measuring system with receiver device 5 can make measurements on two orthogonal polarisations. This measuring mode requires two orthogonal polarising antennas 5' and 5", connected across the two RF inputs of the antenna switch 51. A DC voltage is optionally injected across the RF connectors in order to power an additional LNA amplifier 53 directly at the output of the antennas. The purpose of this is to remove the noise threshold degradation generated by losses in the connecting cables of the antennas. In automatic polarising mode, the antennas, which measure field $E_x$, or respectively $E_y$, can be switched alternately.

Two 50 Ohm, wide band LNA amplifiers 53 can be used for an amplification of around 30 to 40 dB upstream of mixer 54. This mixer can be of the double balanced mixer type, for efficiently removing the mixing frequency injection.

In order to cover the various interesting frequencies, for example GSM, ISM and Bluetooth, at least three switchable synthesisers 58 have been devised in the synthesiser unit. These synthesisers cover the following ranges: 500-1000 MHz, 1370-2000 MHz and 2300-3000 MHz. Selection is ensured by a synthesiser switch 60, controlled by control logic 52. Each synthesiser is fitted with a programmable PLL and has a frequency step of 100 kHz. This precision means that the desired signal can be pre-selected so that it falls within the bandwidth of a last IF filter (approximately 250 kHz). The various synthesisers are programmed by control signals, supplied by control logic 52.

A second frequency conversion can be carried out using a second mixer of SA626 receiver 56 with frequency signals equal to 80 MHz, supplied by oscillator unit 57. These oscillator signals are generated by an overtone quartz at 80 MHz followed by a rapid comparator. A divider-by-8 in oscillator unit 57 can generate a 10 MHz reference that is useful for synthesisers 58 from the clock.

SA626 receiver circuit 56 is fitted with a rapid RSSI. The maximum time for setting up the RSSI voltage is less than 10 µs. In the measuring mode with interpolation between two calculated positions and polarisation change, this application requires a set up time of the order of 1 ms. 20 measurements per image, times 30 images per second, makes 600 measurements per second. SA626 is thus adapted to the measuring system of the invention.

An acquisition card 61 enables the receiver device output signal to be adapted towards computer station 7, and the programming or control signals supplied by the computer station. The digital camera can also be connected to this acquisition card to adapt the captured image signals to be transferred to the computer station. The programmable logic loaded onto the card can thus control the various units.

The card loaded in the receiver device may have a 5 V power supply, so as to generate locally a 22 V voltage using a DC/DC converter that is not shown. This voltage is used by the high-dynamic high frequency synthesisers (VCO).

One receiving antenna 51 can also be configured in the form of a circular polarising patch GPS antenna, arranged on a rectangular earth plane, measuring 7.5×8.5 cm. However, for the receiver device of the measuring system, a dual-linear polarisation horn antenna (2-18 GHz) can be used. The transmitting antenna of the receiver device placed in the spherical element may be capable of working at a frequency of 2.443 GHz and be manufactured with a ¼ wave dipole.

With the measuring system according to the invention, searching for the maximum radiation of any antenna with a simple polarisation dipole normally requires several hours where the spherical element has a maximum rotational speed of the order of 1 revolution per second and sampling at 15 images per second. This time can be reduced to ten minutes for measuring $(E_x^2 + E_y^2)^{1/2}$.

From the description that has just been given, those skilled in the art can devise multiple variants of the radiation diagram measuring system for a transmitting antenna, without departing from the scope of the invention, as defined by the claims. The detection means can be arranged on the positioning device, which could be controlled via the computer station.

The invention claimed is:

1. A system for measuring the radiation diagram of a transmitting antenna, the system including:
  (a) a receiver device provided with at least one fixed receiving antenna for picking up an electromagnetic field to be measured and generated by a transmitting antenna to be belonging to an electronic device;
  (b) a positioning device, on which a support element for the electronic device is placed, wherein the positioning device includes:
    i, means for driving the support element in rotation with the electronic device;

ii, detection means for detecting position or orientation of the transmitting antenna; and iii, a data processing station for processing data supplied by the detection means and by the receiver device, wherein the support element is a spherical hollow element that houses the electronic device and the transmitting antenna, and the spherical element is held on the positioning device by gravity on three points of first support, wherein one point of first support is formed by a drive member in contact with an external surface of the spherical element so as to rotate the spherical element randomly in every direction on the positioning device, and the other two points of first support of the positioning device are each formed by a ball and socket joint, wherein the ball is placed to rotate freely in an end housing of the ball and socket joint so that one portion of the ball emerges through an aperture in the housing to come into contact with the external surface of the spherical element.

2. The measuring system according to claim 1, wherein the drive member is a wheel that comes into contact with the external surface of the spherical element to drive said spherical element in rotation, wherein a rotating axle of the wheel is mounted at an end of a second support that can rotate along a second axle, and the second axle passes through a point of contact of the wheel on the external surface of the spherical element and the center of the spherical element so as to impose a random rotation on the spherical element via the wheel, in every direction.

3. The measuring system according to claim 1, wherein a portion of the ball and socket joint that houses the ball is a nozzle, for bringing compressed air, so that the ball is held in the housing on an air cushion.

4. The measuring system according to claim 1, wherein the detection means include a digital camera that is connected to the data processing station, and figures or references are distributed over the external surface of the spherical element to enable the digital camera, associated with the data processing station, to determine position or orientation of the transmitting antenna when placed in proximity to the center of the spherical element.

5. The measuring system according to claim 4, wherein the figures or references are formed by circular barcodes, and each circular barcode defines a precise position of the spherical element on the positioning device.

6. The measuring system according to claim 5, wherein fourteen different circular barcodes are uniformly distributed over the external surface of the spherical element, wherein each circular barcode is encoded in four bits, and an external delimiting bit of a different colour to a first colour of the external surface of the spherical element so as to define an edge of each figure.

7. The measuring system according to claim 4, further including a lighting device for lighting, in a uniform manner, a portion of the external surface of the spherical element that is visible to the digital camera.

8. The measuring system according to claim 7, wherein the lighting device includes a set of optical fibers guiding light generated by a light source distant from the spherical element so as to provide a homogenous light beam to improve an image of the spherical element, with the various figures visible, captured by the digital camera.

9. The measuring system according to claim 8, wherein the set of optical fibers is divided into several sub-sets of optical fibers, wherein ends of the optical fibers of each sub-set in proximity to the spherical element are secured in plastic studs on a lighting structure.

10. The measuring system according to claim 9, wherein the lighting structure is made of a non-metal material and forms a ring on which a plurality of plastic studs are arranged over the entire periphery of the ring and equidistant from each other for the optical fiber ends of the sub-sets, and the ring is placed in front of the spherical element on at side of the digital camera without obstructing the digital camera's view of the spherical element, and the ends of the optical fibers of each sub-set are oriented so as to direct light beams in the direction of the center of the spherical element.

11. The measuring system according to claim 9, wherein the number of optical fibers per sub-set is at least two optical fibers and whose ends are secured in one of the plastic studs and are equidistant from each other, and are arranged in the form of equilateral triangles.

12. The measuring system according to claim 10, wherein the number of optical fibers per sub-set is at least two optical fibers and whose ends are secured in one of the plastic studs and are equidistant from each other, and are arranged in the form of equilateral triangles.

13. The measuring system according to claim 10, wherein the plurality of plastic studs consists of six plastic studs.

14. The measuring system according to claim 9, wherein the number of optical fibers per sub-set is six optical fibers whose ends are secured in one of the plastic studs and are equidistant from each other, and are arranged in the form of equilateral triangles.

15. The measuring system according to claim 10, wherein the number of optical fibers per sub-set is six optical fibers whose ends are secured in one of the plastic studs and are equidistant from each other, and are arranged in the form of equilateral triangles.

* * * * *